(12) United States Patent
Ohki

(10) Patent No.: US 6,184,728 B1
(45) Date of Patent: Feb. 6, 2001

(54) OUTPUT CIRCUIT

(75) Inventor: Nobuhiro Ohki, Tokyo (JP)

(73) Assignee: NEC Corporation (JP)

( * ) Notice: Under 35 U.S.C. 154(b), the term of this patent shall be extended for 0 days.

(21) Appl. No.: 09/433,252

(22) Filed: Nov. 4, 1999

(30) Foreign Application Priority Data

Nov. 5, 1998 (JP) .................................................. 10-314228

(51) Int. Cl.[7] .................................................... H03K 3/00
(52) U.S. Cl. ............................................... 327/108; 327/77
(58) Field of Search ................................. 327/65, 77, 89,
327/108, 111, 112, 333, 427, 434, 437,
478; 326/82, 83, 124, 126, 127, 128, 129

(56) References Cited

U.S. PATENT DOCUMENTS

| | | | |
|---|---|---|---|
| 4,988,895 | * 1/1991 | Kihara et al. | 327/65 |
| 5,136,183 | * 8/1992 | Moyal et al. | 327/65 |
| 6,091,266 | * 7/2000 | Pohlmann | 326/126 |

FOREIGN PATENT DOCUMENTS

| | | | |
|---|---|---|---|
| 5243861 | 9/1993 | (JP) | H03F/1/42 |
| 5267955 | 10/1993 | (JP) | H03F/3/45 |
| 6177681 | 6/1994 | (JP) | H03G/3/30 |
| 8316737 | 11/1996 | (JP) | H03D/7/00 |

* cited by examiner

Primary Examiner—Toan Tran
(74) Attorney, Agent, or Firm—Hayes, Soloway, Hennessey, Grossman & Hage, P.C.

(57) ABSTRACT

In an output circuit, there are provided a first transistor connected to an output terminal and a first resistor element connected to the first transistor. A second transistor is connected in cascade to the first transistor. A second resistor element is connected between the second transistor and the ground. An emitter follower having a level shift function is connected to the first and second transistors. There are also provided an input circuit which inputs a first input signal and a second input signal to the emitter follower. The first and second input signals are opposite to each other in phase.

12 Claims, 4 Drawing Sheets

OUTPUT CIRCUIT

BACKGROUND OF THE INVENTION

1. Field of the Invention

The present invention relates to an output circuit to be used in an amplifier or the like, and relates, more particularly, to an output circuit with an enlarged output dynamic range.

2. Description of Related Art

In general, an amplifier has built therein an input circuit for inputting a signal from the outside of the amplifier and an output circuit for outputting a signal to the outside of the amplifier, and the like. FIG. 1 is a circuit diagram for showing a conventional output circuit.

The conventional output circuit is provided with a differential amplifier circuit portion 11 having a differential amplifier circuit for producing an in-phase signal and an opposite-phase signal with respect to an input signal, and an output-stage circuit portion 12 having output-stage transistors T21 and T22 with multi-stage connections.

The differential amplifier circuit portion 11 has transistors T23 and T24 differentially connected to each other. The base of the transistor T23 is connected to an input terminal of the output circuit. To the collectors of the transistors T23 and T24, resistor elements R23 and R24 re connected respectively. Further, to the emitters of the transistors T23 and T24, resistor elements R25 and R26 are connected respectively. The resistor elements R25 and R26 are connected with a constant current source I21 for generating a constant current. The base of the transistor T24 is connected to the connection point of resistor elements R27 and R28 connected in series.

In the output-stage circuit portion 12, an output terminal of the output circuit and a resistor element 21 are connected to the emitter of the output-stage transistor T21. A resistor element R22 is connected to the emitter of the output-stage transistor T22. The base of the output-stage transistor T21 is connected to a connection point "c" between the transistor T23 and the resistor element R23, and the base of the output-stage transistor T22 is connected to a connection point "d" between the transistor T24 and the resistor element R24.

A positive power is supplied to the resistor elements R23, R24 and R27 and the collectors of the output-stage transistors T21 and T22. The constant current source I21 and the resistor elements R21, R22 and R28 are grounded.

When an input signal of an amplitude V21 is supplied to the conventional output circuit having the abovedescribed structure, this input signal is amplified into output signals with amplitudes V22 and V22' respectively by the amplification effect of the transistors T23 and T24. In this case, the output signal V22 becomes in opposite phase to the input signal, and the output signal V22' becomes in-phase with the input signal, so that the emitter potential of the output-stage transistor T21 becomes in the opposite phase.

However, there is a problem that the output dynamic range of the above-described conventional output circuit is constrained by a collector-emitter voltage $V_{CE1}$ of the transistors T23 and T24 within the differential amplifier circuit portion 11 and by a collector-emitter voltage $V_{CE2}$ of the output-stage transistor T21 within the output-stage circuit portion 12.

In other words, the output dynamic range of the conventional output circuit becomes V22≦r23×i21 when the resistance value of the resistor element R23 is expressed as r23 and the current value of the constant current value I21 is expressed as i21. However, this output dynamic range is constrained by the collector-emitter voltages of the transistors T21, T23 and T24 as shown by the following formula 1.

$$V22 \leq r23 \times i21 < V_{CE1} < V_{CE2} \qquad (1)$$

Therefore, for example, when the potential of the connection point "c" becomes low, the emitter potential of the output-stage transistor T21 also becomes low. Thus, the margin of the collector-emitter voltage $V_{CE2}$ of the output-stage transistor T21 becomes the minimum. As the emitter potential and the collector potential of the output-stage transistor become opposite phase components, the output dynamic range is constrained by the performance (collector-emitter voltage) of the transistor.

SUMMARY OF THE INVENTION

It is an object of the present invention to provide an output circuit capable of obtaining a wide dynamic range without depending on the collector-emitter voltage of the transistor.

According to one aspect of the present invention, an output circuit comprises a first transistor connected to an output terminal, a first resistor element connected to the first transistor, a second transistor connected to the first transistor in cascade, a second resistor element connected between the second transistor and the ground, an emitter follower connected to the first and second transistors, the emitter follower having a level shift function, and an input circuit which inputs a first input signal and a second input signal to the emitter follower, the first and second input signals being opposite to each other in phase.

According to another aspect of the invention, an output circuit comprises a first bipolar transistor or MOS transistor whose collector or drain is connected to an output terminal, a first resistor element connected to the collector or drain of the first bipolar transistor or MOS transistor, a second bipolar transistor or MOS transistor connected to the first bipolar transistor or MOS transistor in cascade, a second resistor element connected between an emitter or source of the second bipolar transistor or MOS transistor and the ground, an emitter follower connected to each base or gate of the first and second bipolar transistors or MOS transistors, the emitter follower having a level shift function, and an input circuit which inputs a first input signal and a second input signal to the emitter follower, the first and second input signals being opposite to each other in phase.

According to the above aspects of the invention, signals of mutually opposite phases are input to the first and second transistors, and driving currents of the first and second transistors follow the input signals. Accordingly, it is possible to obtain a wide dynamic range without depending on the performance of these transistors.

Further, the output circuit may comprise a positive power source or a negative power source connected to the first resistor element and the emitter follower.

Furthermore, the emitter follower may have a third transistor to which the first input signal is applied and a fourth transistor to which the second input signal is applied.

DETAILED DESCRIPTION OF THE PREFERRED EMBODIMENTS

Figure 2:
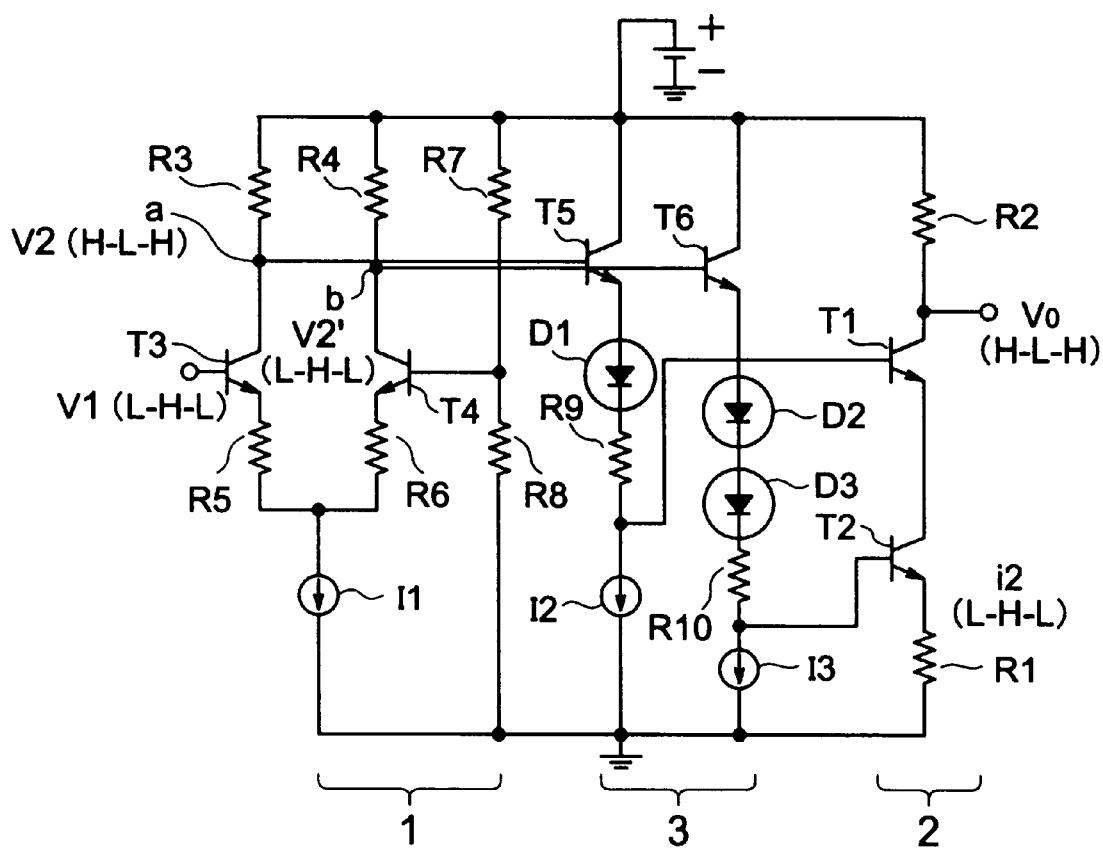
FIG. 2 is a circuit diagram for showing an output circuit relating to a first embodiment of the present invention.

There will be explained in detail below an output circuit relating to embodiments of the present invention with reference to the attached drawings. FIG. 2 is a circuit diagram for showing an output circuit relating to a first embodiment of the present invention.

The output circuit of the first embodiment is provided with a differential amplifier circuit portion 1 having a differential amplifier circuit for producing an in-phase signal and an opposite-phase signal with respect to an input signal. The output circuit is also provided with an output-stage circuit portion 2 having output-stage transistors T1 and T2 with multi-stage connections, and an emitter follower portion 3 for adjusting base potentials of the output-stage transistors T1 and T2 within the output-stage circuit portion 2.

The differential amplifier circuit portion 1 has transistors T3 and T4 differentially connected to each other. The base of the transistor T3 is connected to an input terminal of the output circuit. Resistor elements R3 and R4 are connected to the collectors of the transistors T3 and T4 respectively. Further, to the emitters of the transistors T3 and T4, resistor elements R5 and R6 are connected. The resistor elements R5 and R6 are connected with a constant current source I1 for generating a constant current. The base of the transistor T4 is connected to the connection point of resistor elements R7 and R8 connected in series.

In the output-stage circuit portion 2, the output-stage transistors T1 and T2 are connected in cascade, with an output terminal of the output circuit connected to the collector of the output-stage transistor T1. Further, a resistor element R1 is connected to the emitter of the output-stage transistor T2, and a resistor element R2 is connected to the collector of the output-stage transistor T1.

In the emitter follower portion 3, there are provided a transistor T5 whose base is connected to a connection point "a" between the transistor T3 and the resistor element R3, and a transistor T6 whose base is connected to a connection point "b" between the transistor T4 and the resistor element R4. Then, a diode D1 is connected to the emitter of the transistor T5, and a resistor element R9 is connected to this diode D1. Further, a constant current source I2 is connected to the resistor element R9. The base of the output-stage transistor T1 is connected to a connection point between the resistor element R9 and the constant current source I2. Two diodes D2 and D3 are connected in series to the emitter of the transistor T6, with a resistor element R10 connected to the diode D3. A constant current source I3 is connected to the resistor element R10. The base of the output-stage transistor T2 is connected to a connection point between the resistor element R10 and the constant current source I3. The emitter follower portion 3 having the above-described structure has a level shift function.

A positive power is supplied to the resistor elements R2, R3, R4 and R7 and the collectors of the transistors T5 and T6. The constant current sources I1 to I3 and the resistor elements R1 and R8 are grounded.

When an input signal of an amplitude V1 is supplied to the output circuit of the first embodiment having the above-described structure, this input signal is amplified into an output signal V2 determined by the constant current source I1 and the resistor element R3 at the connection point "a" between the transistor T3 and the resistor element R3 of the differential amplifier circuit portion 1. In this case, the potential of the connection point "a" is of an opposite phase component with respect to the input signal. Similarly, this input signal is amplified into an output signal V2' determined by the constant current source I1 and the resistor element R4 at the connection point "b" between the transistor T4 and the resistor element R4 of the differential amplifier circuit portion 1. In this case, the output signal V2' is output in an amplified form as an in-phase component with respect to the input signal.

The output signals V2 and V2' produced from the differential amplifier circuit portion 1 are input to the emitter follower portion 3. Then, the output signals V2 and V2' are adjusted with a DC current by the diodes D1 and D3 and the resistor elements R9 and R10 and so on so that these output signals become optimum as base potentials of the output-stage transistors T1 and T2, which are connected in multi-stage.

In the output-stage circuit portion 2, the current i2 changes in phase with the input signal by the variation of the emitter potential of the output-stage transistor T2 based on the output signal V2' and the resistor element R1. Based on this current i2, the collector potential of the output-stage transistor T1 becomes in phase with the output signal V2, and the margin of the collector-emitter voltage $V_{CE}$ of the output-stage transistor T1 is expanded.

Assume, for example, that a withstanding voltage $V_{CE}$ of the output-stage transistor T1 is expressed as α to β, a base potential is represented by γ, an amplitude of the base portion is represented by δ, an output amplitude is expressed as ε, a power source voltage is expressed as $V_{CC}$, and a base-emitter potential of the output-stage transistor T1 is expressed as $V_{BE}$. Then, the collector-emitter voltage $V_{CE}$ is expressed by the following formula 2 at the time of a low output, and is expressed by the formula 3 at the time of a high output.

$$V_{CE}=V_{CC}-\epsilon-\gamma+\delta/2+V_{BE} \qquad (2)$$

$$V_{CE}=V_{CC}-\epsilon-\delta/2+V_{BE} \qquad (3)$$

Figure 1:
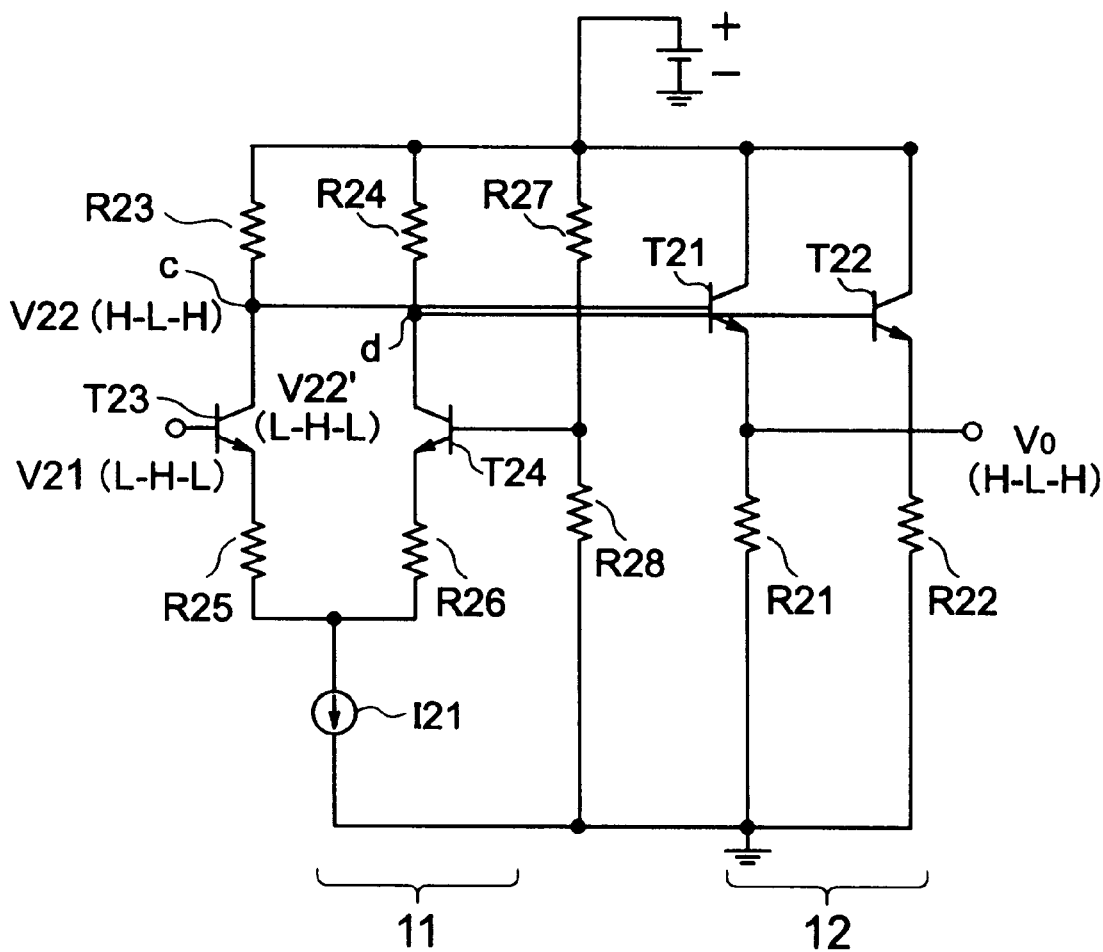
FIG. 1 is a circuit diagram for showing a conventional output circuit.

On the other hand, the collector-emitter voltage $V_{CE}$ of the output-stage transistor T21 in the conventional output circuit shown in FIG. 1 is expressed by the following formula 4 at the time of a low output, and is expressed by the formula 5 at the time of a high output.

$$V_{CE}=V_{CC}-\epsilon-\gamma-\delta/2+V_{BE} \qquad (4)$$

$$V_{CE}=V_{CC}-\epsilon+\delta/2+V_{BE} \qquad (5)$$

Therefore, according to the present embodiment, at both a low output time and a high output time, it is possible to obtain a larger margin $V_{CE}$ of the amplitude portion δ of the base portion than in the conventional circuit. This is because the potential (output signal V2') in phase with the input signal and the potential (output signal V2) opposite phase from the input signal in the differential amplifier circuit portion 1 are applied to each base of the two transistors in multi-stage connection, and the base potential and the collector potential of the output-stage transistors T1 and T2 become in-phase potentials to each other.

Assume, for example, that the withstanding voltage $V_{CE}$ of the output-stage transistor is 0.3 to 2 V, the base potential γ of the output-stage transistor is 4 V, the amplitude δ of the base portion is 0.4 V, the output amplitude ε is 1 V, the power source voltage $V_{CC}$ is 5 V, and the base-emitter potential $V_{BE}$ is 0.6 V. Then, the collector-emitter voltage $V_{CE}$ in the present embodiment is expressed by the following formula 6 at the time of a low output, and is expressed by the formula 7 at the time of a high output. On the other hand, the collector-emitter voltage $V_{CE}$ in the conventional output circuit shown in FIG. 1 is expressed by the following formula 8 at the time of a low output, and is expressed by the formula 9 at the time of a high output.

$$0.3 \leq V_{CE} = 5-1-4+0.4/2+0.6 = 0.8 \text{ V} \quad (6)$$

$$V_{CE} = 5-4-0.4/2+0.6 = 1.4 \text{ V} \leq 2.0 \quad (7)$$

$$0.3 < V_{CE} = 5-1-4-0.4/2+0.6 = 0.4 \text{ V} \quad (8)$$

$$V_{CE} = 5-4+0.4/2+0.6 = 1.8 \text{ V} \leq 2.0 \quad (9)$$

As shown in the formulas 6 and 7, according to the present embodiment, the margin $V_{CE}$ at the time of a low output is 0.5 V, and the margin $V_{CE}$ at the time of a high output is 0.6 V. On the other hand, as shown in the formulas 8 and 9, according to the conventional output circuit, the margin $V_{CE}$ at the time of a low output is only 0.1 V, and the margin $V_{CE}$ at the time of a high output is only 0.2 V. In other words, according to the present embodiment, in both cases of a low output and a high output, the margin $V_{CE}$ is larger by 0.4 V, which is the amplitude δ of the base.

As explained above, according to the first embodiment, it is possible to obtain a wide dynamic range output without depending on the performance ($V_{CE}$ withstanding voltage) of the transistors.

Figure 3:
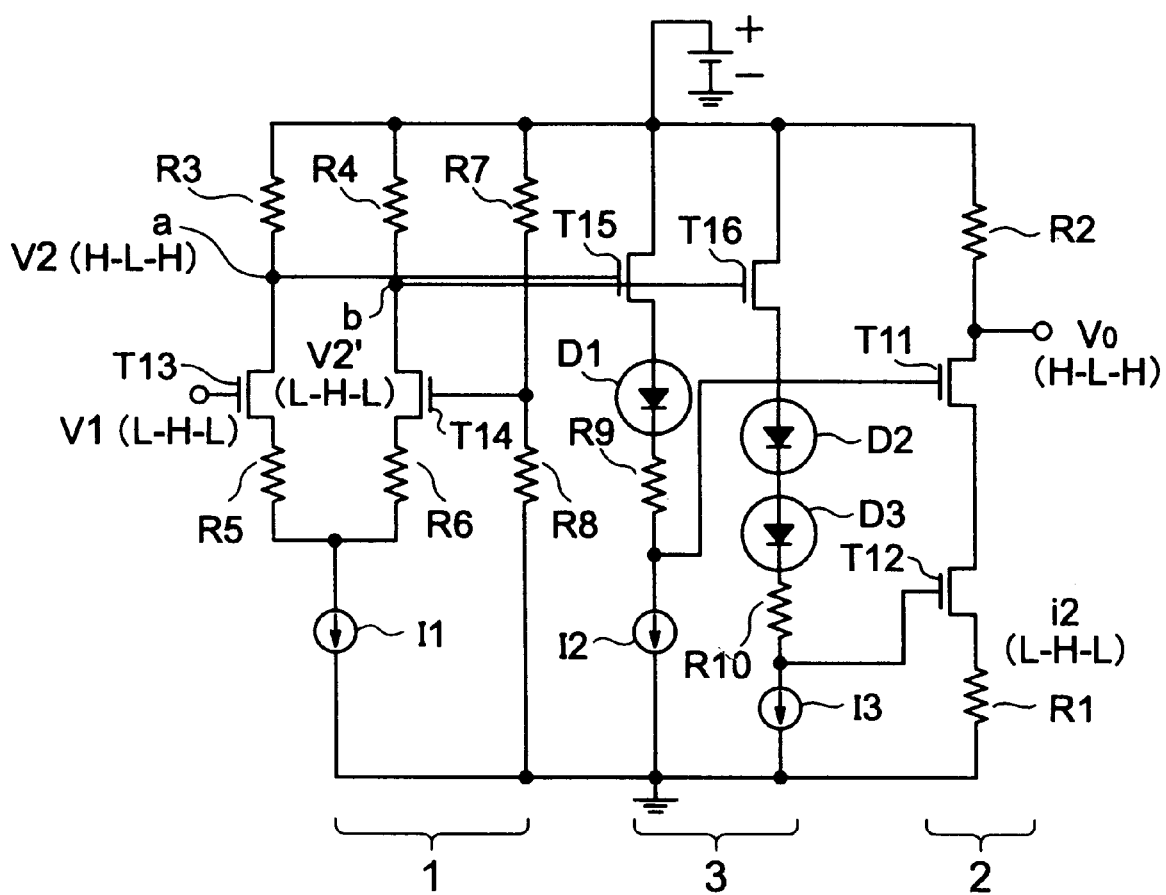
FIG. 3 is a circuit diagram for showing an output circuit relating to a second embodiment of the present invention.

In the above first embodiment, bipolar transistors are used as the output-stage transistors T1 and T2 and others. However, MOS transistors may also be used as the output-stage transistors T1 and T2 and others. FIG. 3 is a circuit diagram for showing an output circuit relating to a second embodiment of the present invention. In the second embodiment shown in FIG. 3, structural elements identical with those in the first embodiment shown in FIG. 2 are attached with like reference symbols and their detailed explanation will be omitted.

In the second embodiment, the bipolar transistors T1 to T6 of the first embodiment are substituted by MOS transistors T11 to T16 respectively. Each gate of the MOS transistors is connected to a portion to which each base of the bipolar transistors is connected in the first embodiment. Similarly, each drain is connected to a portion to which each collector is connected, and each source is connected to a portion to which each emitter is connected.

In the second embodiment having the above-described structure, it is also possible to obtain a wide dynamic range output with a larger margin of the collector-emitter voltage $V_{CE}$ of the output-stage transistor as compared with the prior-art.

Figure 4:
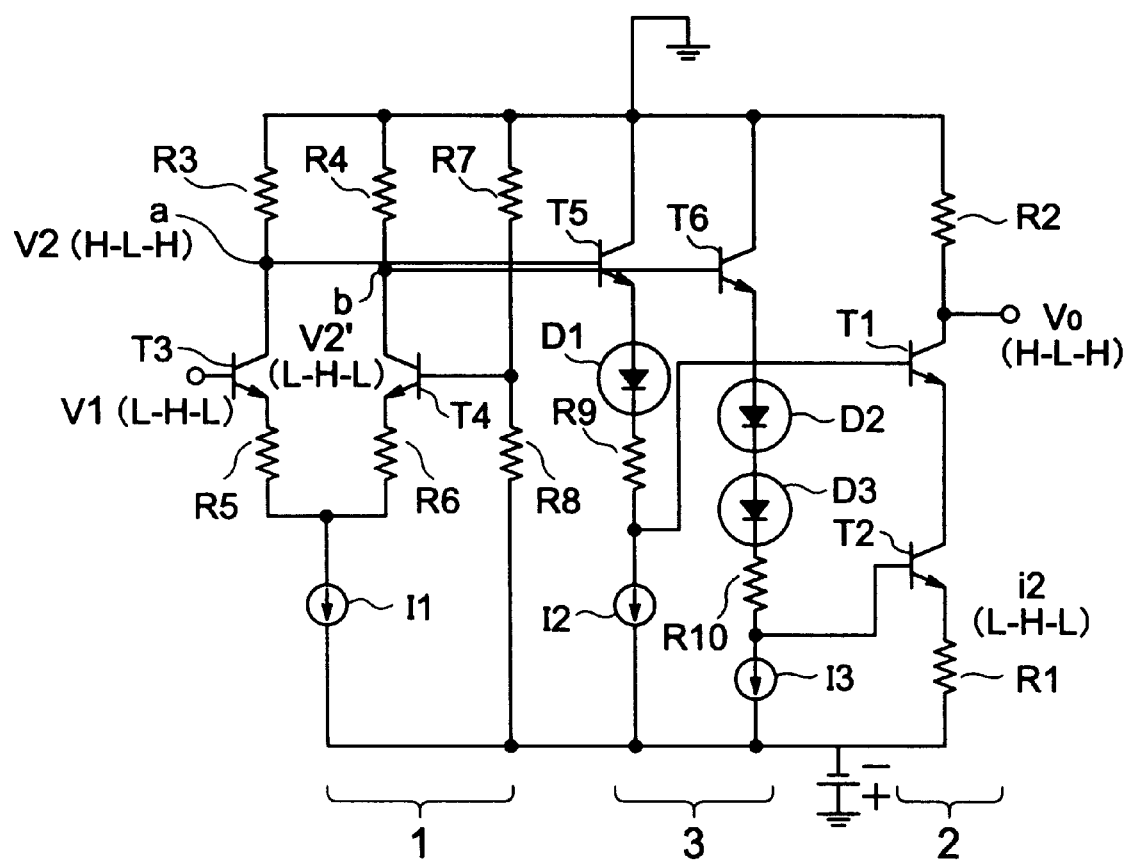
FIG. 4 is a circuit diagram for showing an output circuit relating to a third embodiment of the present invention.

While a positive power source is used in the first embodiment, a negative power source may be used. FIG. 4 is a circuit diagram for showing an output circuit relating to a third embodiment of the present invention. In the third embodiment shown in FIG. 4, structural elements identical with those in the first embodiment shown in FIG. 2 are attached with like reference symbols and their detailed explanation will be omitted.

In the third embodiment, the resistor elements R2, R3, R4 and R7 and the collectors of the transistors T5 and T6 are grounded, and the constant current sources I1, I2 and I3 and the resistor elements R1 and R8 are connected to a negative power source.

In the third embodiment having the above-described structure, it is also possible to obtain a wide dynamic range output with a larger margin of the collector-emitter voltage $V_{CE}$ of the output-stage transistor as compared with the prior-art.

In the second embodiment, in stead of the positive power source, a negative power source may also be used. Further, bipolar transistors and MOS transistors may be coexistent in an output circuit.

As explained above, according to the present invention, it is possible to obtain a wide dynamic range without depending on the performance of the transistors within the output circuit.

What is claimed is:

1. An output circuit comprising:
   a first transistor connected to an output terminal;
   a first resistor element connected to said first transistor;
   a second transistor connected to said first transistor in cascade;
   a second resistor element connected between said second transistor and the ground;
   an emitter follower connected to said first and second transistors, said emitter follower having a level shift function; and
   an input circuit which inputs a first input signal and a second input signal to said emitter follower, said first and second input signals being opposite to each other in phase.

2. An output circuit comprising:
   a first bipolar transistor whose collector is connected to an output terminal;
   a first resistor element connected to said collector of said first bipolar transistor;
   a second bipolar transistor connected to said first bipolar transistor in cascade;
   a second resistor element connected between an emitter of said second bipolar transistor and the ground;
   an emitter follower connected to each base of said first and second bipolar transistors, said emitter follower having a level shift function; and
   an input circuit which inputs a first input signal and a second input signal to said emitter follower, said first and second input signals being opposite to each other in phase.

3. An output circuit comprising:
   a first MOS transistor whose drain is connected to an output terminal;
   a first resistor element connected to said drain of said first MOS transistor;
   a second MOS transistor connected to said first MOS transistor in cascade;
   a second resistor element connected between a source of said second MOS transistor and the ground;
   an emitter follower connected to each gate of said first and second MOS transistors, said emitter follower having a level shift function; and
   an input circuit which inputs a first input signal and a second input signal to said emitter follower, said first and second input signals being opposite to each other in phase.

4. The output circuit according to claim 1, which further comprising a positive power source connected to said first resistor element and said emitter follower portion.

5. The output circuit according to claim 2, which further comprising a positive power source connected to said first resistor element and said emitter follower portion.

6. The output circuit according to claim 3, which further comprising a positive power source connected to said first resistor element and said emitter follower portion.

7. The output circuit according to claim 1, which further comprising a negative power source connected to said first resistor element and said emitter follower portion.

8. The output circuit according to claim 2, which further comprising a negative power source connected to said first resistor element and said emitter follower portion.

9. The output circuit according to claim 3, which further comprising a negative power source connected to said first resistor element and said emitter follower portion.

10. The output circuit according to claim 1, wherein said emitter follower portion has a third transistor to which said first input signal is applied and a fourth transistor to which said second input signal is applied.

11. The output circuit according to claim 2, wherein said emitter follower portion has a third bipolar transistor to which said first input signal is applied and a fourth bipolar transistor to which said second input signal is applied.

12. The output circuit according to claim 3, wherein said emitter follower portion has a third MOS transistor to which said first input signal is applied and a fourth MOS transistor to which said second input signal is applied.

* * * * *